(12) United States Patent
Booth, Jr. et al.

(10) Patent No.: US 8,564,069 B1
(45) Date of Patent: Oct. 22, 2013

(54) FIELD EFFECT TRANSISTORS WITH LOW BODY RESISTANCE AND SELF-BALANCED BODY POTENTIAL

(75) Inventors: Roger A. Booth, Jr., Irvine, CA (US); Kangguo Cheng, Schenectady, NY (US); Joseph Ervin, Wappingers Falls, NY (US); Chengwen Pei, Danbury, CT (US); Ravi M. Todi, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/590,212

(22) Filed: Aug. 21, 2012

(51) Int. Cl.
*H01L 27/088* (2006.01)

(52) U.S. Cl.
USPC .................................. 257/387; 257/E29.264

(58) Field of Classification Search
USPC ......................... 257/337, 386, 387, E29.264
See application file for complete search history.

(56) References Cited

U.S. PATENT DOCUMENTS

| | | | |
|---|---|---|---|
| 5,573,961 A | 11/1996 | Hsu et al. | |
| 6,054,736 A * | 4/2000 | Shigehara et al. | 257/336 |
| 6,320,225 B1 | 11/2001 | Hargrove et al. | |
| 6,344,671 B1 | 2/2002 | Mandelman et al. | |
| 6,815,282 B2 | 11/2004 | Dachtera et al. | |
| 6,960,810 B2 | 11/2005 | Fechner | |
| 7,005,705 B2 | 2/2006 | Maeda et al. | |
| 7,679,139 B2 | 3/2010 | Larsen et al. | |
| 7,687,365 B2 | 3/2010 | Sleight | |
| 7,732,287 B2 | 6/2010 | Fechner et al. | |
| 7,880,239 B2 * | 2/2011 | Wirbeleit | 257/393 |

OTHER PUBLICATIONS

Hirano et al., "Impact of 0.10 μm SOI CMOS with Body-Tied Hybrid Trench Isolation Structure to Break Through the Scaling Crisis of Silicon Technology," IEDM 2000, pp. 467-470.
Matloubian, "Smart Body Contact for SOI MOSFETs," 1989, pp. 128-129, IEEE SOS/SOI Technology Conference.
Min et al., "Partial Trench Isolated Body-Tied (PTIBT) Structure for SOI Applications," 2001, pp. 71-72, IEEE International SOI Conference, Oct. 2001.
Oh et al., "The Effect of Body Contact Arrangement on Thin SOI MOSFET Characteristics," 1995, pp. 467-470, Microelectronic Engineering 28, vol. 28, No. 1-4.
Lam et al., "An Enhanced Compact Waffle MOSFET with Low Drain Capacitance from a standard Submicron CMOS Technology," May 2002, pp. 785-789, Solid State Electronics, vol. 47 (2003), available online at: www:sciencedirect.com.
Abou-Khalil, "A Field Effect Transistor Having OHMIC Body Contact(s), an Integrated Circuit Structure Incorporating Stacked Field Effect Transistors with Such OHMIC Body Contacts and Associated Methods," U.S. Appl. No. 12/983,925, filed Jan. 4, 2011, pp. 1-55.

* cited by examiner

*Primary Examiner* — Chandra Chaudhari
(74) *Attorney, Agent, or Firm* — Yuanmin Cai; Hoffman Warnick LLC

(57) ABSTRACT

Embodiments of the invention relate generally to semiconductor devices and, more particularly, to semiconductor devices having field effect transistors (FETs) with a low body resistance and, in some embodiments, a self-balanced body potential where multiple transistors share same body potential. In one embodiment, the invention includes a field effect transistor (FET) comprising a source within a substrate, a drain within the substrate, and an active gate atop the substrate and between the source and the drain, an inactive gate structure atop the substrate and adjacent the source or the drain, a body adjacent the inactive gate, and a discharge path within the substrate for releasing a charge from the FET, the discharge path lying between the active gate of the FET and the body, wherein the discharge path is substantially perpendicular to a width of the active gate.

20 Claims, 12 Drawing Sheets

FIELD EFFECT TRANSISTORS WITH LOW BODY RESISTANCE AND SELF-BALANCED BODY POTENTIAL

FIELD OF INVENTION

Embodiments of the invention relate generally to semiconductor devices and, more particularly, to semiconductor devices having field effect transistors (FETs) with a low body resistance and, in some embodiments, a self-balanced body potential where multiple transistors share a same body potential.

BACKGROUND

FIG. 1 is a demonstrative illustration of a top view of a known semiconductor device 1 including a CMOSFET 6 within a silicon substrate 2. CMOSFET 6 comprises a gate 5 between a first-heavily doped region 3, acting as a source, and a second heavily-doped region 3', acting as a drain. Heavily-doped regions 3 and 3' may include, for example, phosphorous-doped silicon carbide (SiC:P) in the case that CMOSFET 6 is n-type FET or SiGe:B in the case that CMOSFET 6 is a p-type FET.

Source 3 and drain 3' each include a contact, 4 and 4', respectively, and are connected to a common body 7. Common body 7 also includes a contact, 4".

FIGS. 2 and 3 are demonstrative illustrations of cross-sectional views of semiconductor device 1 taken through axes A-A and B-B, respectively, of FIG. 1. One deficiency of the illustrated known device 1 is that the discharge path 8 (FIG. 3) of CMOSFET 6 is parallel to a width $W_G$ of gate 5. As a consequence, the resistance of discharge path 8 of CMOSFET 6 increases with increasing gate width.

BRIEF SUMMARY

According to one embodiment, the invention provides a semiconductor device comprising: a substrate; a field effect transistor (FET) comprising: a source within the substrate; a drain within the substrate; and an active gate atop the substrate and between the source and the drain; an inactive gate structure atop the substrate and adjacent the source or the drain; a body adjacent the inactive gate; and a discharge path within the substrate for releasing a charge from the FET, the discharge path lying between the active gate of the FET and the body, wherein the discharge path is substantially perpendicular to a width of the active gate, the width of the active gate being a distance along a longitudinal axis of the active gate from a first end of the active gate to a second end of the active gate opposite the first end.

In another embodiment, the invention provides a semiconductor device comprising: a substrate; a first field effect transistor (FET) comprising: a first source within the substrate; a first drain within the substrate; and a first gate atop the substrate and between the first source and the first drain; a second FET adjacent the first FET, the second FET comprising: a second gate atop the substrate and adjacent the first drain of the first FET; and a second drain within the substrate and adjacent the second gate; a common body adjacent the second drain; and a discharge path within the substrate for releasing a charge from each of the first FET and the second FET, the discharge path lying between the first source and the common body, wherein the discharge path is substantially perpendicular to a width of the first gate, the width of the first gate being a distance along a longitudinal axis of the first gate from a first end of the first gate to a second end of the first gate opposite the first end.

In still another embodiment, the invention provides a semiconductor device comprising: a substrate; a field effect transistor (FET) comprising: a source within the substrate; a drain within the substrate; and an active gate atop the substrate and between the source and the drain; an additional gate atop the substrate and adjacent the source or the drain; and a body adjacent the additional gate, wherein the substrate includes a portion positioned between a pair of shallow trench isolations (STIs), the portion of the substrate having a substantially wedge shaped cross-section, a lower portion of the portion of the substrate extending laterally to a greater distance than an upper portion of the portion of the substrate, such that the lower portion is disposed beneath a portion of at least one of the STIs.

The illustrative aspects of the present invention are designed to solve the problems herein described and other problems not discussed, which are discoverable by a skilled artisan.

BRIEF DESCRIPTION OF THE SEVERAL VIEWS OF THE DRAWINGS

These and other features of embodiments of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements among the drawings.

DETAILED DESCRIPTION OF THE EMBODIMENTS

Figure 4:
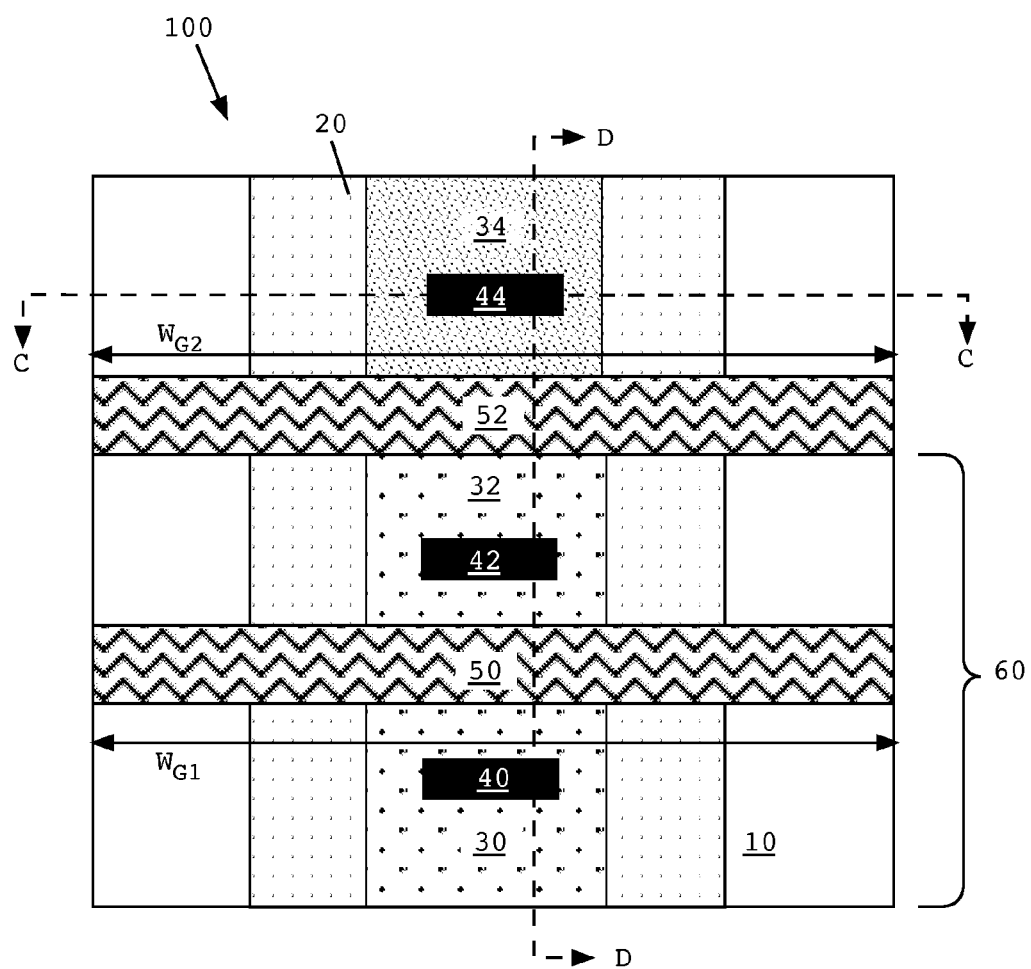
FIGS. 4-6 are demonstrative illustrations of top and cross-sectional views of a semiconductor device according to an embodiment of the invention.

FIG. 4 is a demonstrative illustration of a top view of a semiconductor device 100 according to an embodiment of the invention. Semiconductor device 100 includes a silicon substrate 20 on or within which may be formed a field effect transistor (FET). Those skilled in the art will recognize, of course, that semiconductor substrates other than silicon may also be employed, the use of silicon in the described embodiments being merely for the purpose of illustration. Other suitable substrate materials include, for example, germanium, silicon germanium, and silicon carbide.

FIG. 4 shows an n-type FET (n-FET) 60 comprising a first heavily-doped SiC:P region 30, acting as source, a second heavily-doped SiC:P region 32, acting as drain, and an active gate 50 therebetween. Each of first SiC:P region 30 and second SiC:P region 32 includes a contact, 40 and 42, respectively. Although first SiC:P region 30 and second SiC:P region 32 are described with respect to the embodiment of FIG. 4 as including phosphorous as the n-type dopant employed, other n-type dopants may also be used, including, for example, arsenic, antimony, sulphur, selenium, or tin. Similarly, one skilled in the art will recognize that a p-type FET (p-FET) may alternatively be formed by using a p-type dopant, such as boron or $BF_2$, rather than an n-type dopant. In another embodiment, instead of acting as source and drain respectively, SiC:P region 30 may act as drain and SiC:P region 32 may act as source, depending on how n-FET 60 is used. As such, according to some embodiments of the invention, one region of a FET device may be referred to as a "source/drain" and another, counterpart region be referred to as a "drain/source." One skilled in the art will recognize that such terminology is meant to refer merely to the ability of either region to function as a source or a drain, with both regions functioning as a source—drain pair.

Unlike known devices, semiconductor device 100 includes a second, inactive gate structure 52 adjacent second SiC:P region 32. The presence of inactive gate structure 52 separates SiC:P region 32 from SiGe:B region 34, which acts as a body contact area, on the other side of inactive gate structure 52. This reorients a discharge path within substrate 20, as compared to known devices. Specifically, the discharge path is substantially perpendicular to a width $W_{G1}$ of active gate 50 and/or a width $W_{G2}$ of inactive gate structure 52, the widths of active gate 50 and inactive gate structure 52 defined as a distance along a longitudinal axis of the gate from a first end to a second end opposite the first end. With this configuration, the wider the FET, the greater the benefit that may be gained, as compared to conventional devices. As used herein, the term "inactive" is meant to convey that inactive gate structure 52 is not directly involved in the function of n-FET 60, aside from the described orientation of discharge path. Similarly, "gate structure" is meant to convey that the feature is formed substantially as would be a functional gate, but that the feature, in some embodiments of the invention, does not function as a gate within a device, such as a FET.

Figure 5:
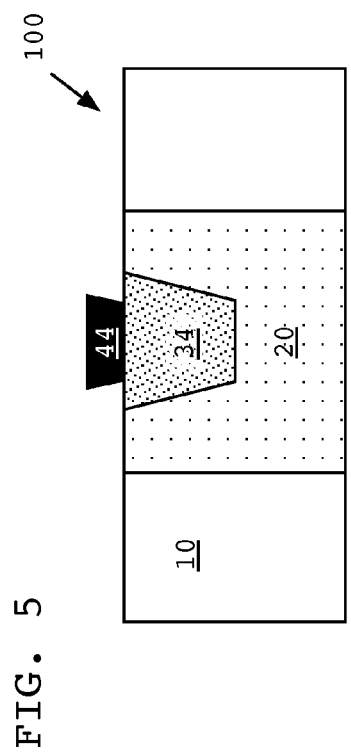

FIG. 5 is a demonstrative illustration of a cross-sectional view of semiconductor device 100 taken through axis C-C of FIG. 4, showing a cross-sectional shape of SiGe:B region 34. First SiC:P region 30 and second SiC:P region 32 may have cross-sectional shapes similar to that of SiGe:B region 34.

Figure 6:
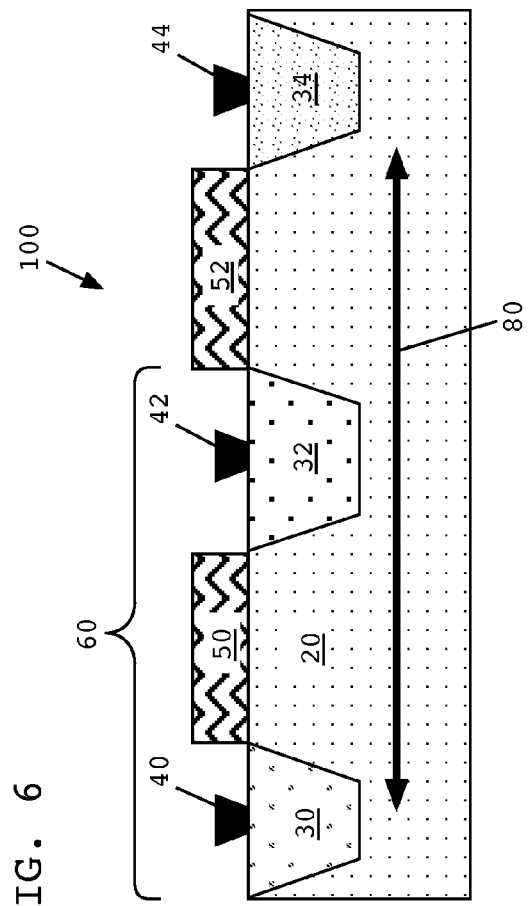

FIG. 6 is a demonstrative illustration of a cross-sectional view of semiconductor device 100 taken through axis D-D of FIG. 4, showing discharge path 80 extending from first SiC:P region 30 to SiG:B region 34. FIG. 6 also shows the cross-sectional shapes of first SiC:P region 30, second SiC:P region 32, and SiGe:B region 34.

Figure 1:
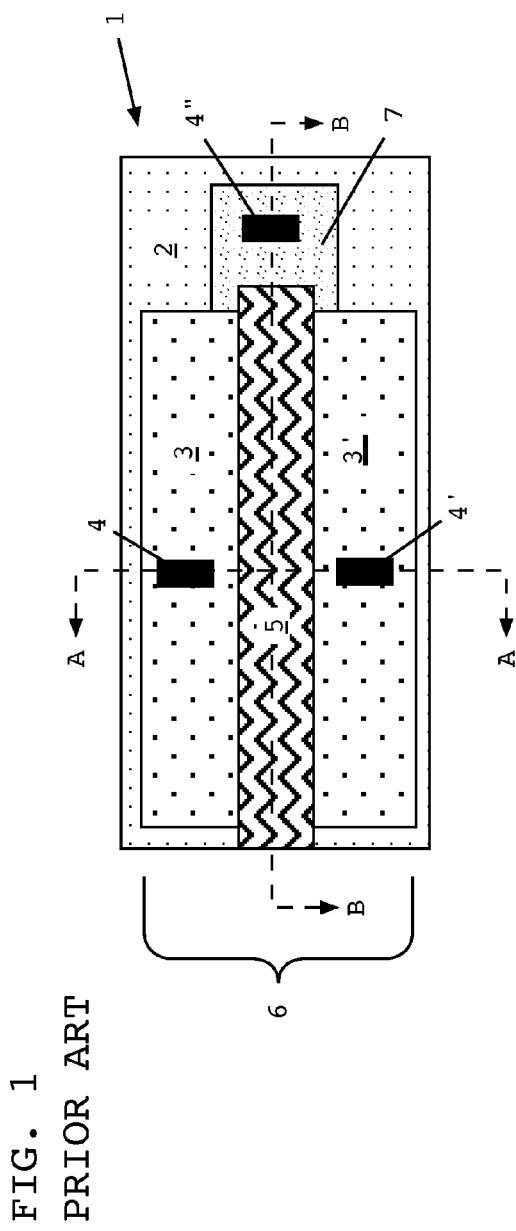
FIGS. 1-3 are demonstrative illustrations of top and cross-sectional views of a known device.
Figure 2:
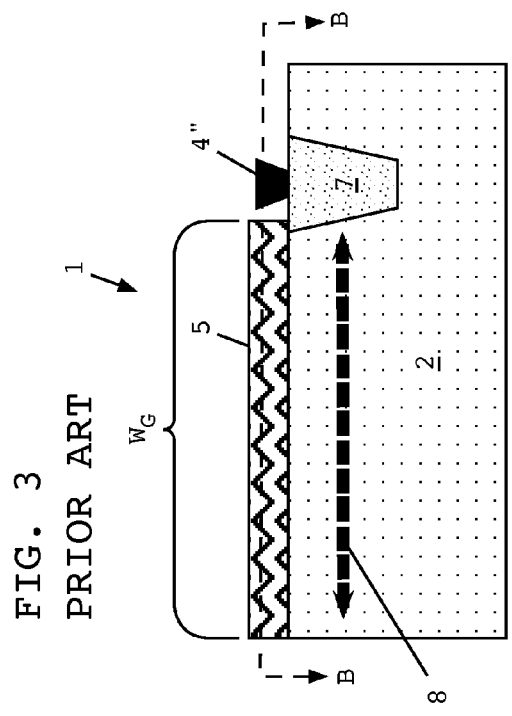
Figure 3:
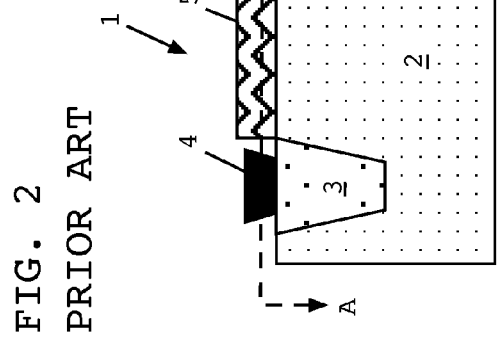

In some embodiments of the invention, distances between active gate 50 and inactive gate structure 52 may be between about 50 nm and about 200 nm. Widths of active gate 50 and/or inactive gate structure 52, according to some embodiments of the invention, may be between about 0.2 μm and about 5 μm. As such, discharge path 80 is typically shorter than discharge paths in known devices, which, as described above, are oriented substantially parallel to, and extend the width of, the FET gate 5 (FIG. 3). As a consequence, resistance of discharge path 80 is typically less than that in known devices and is independent of gate width.

As shown in FIGS. 4 and 5, SiGe:B region 34 and contact 44, serve as a body and body contact, respectively. Semiconductor device 100 also includes a shallow trench isolation (STI) 10 for separating n-FET 60 from adjacent structures.

Figure 7:
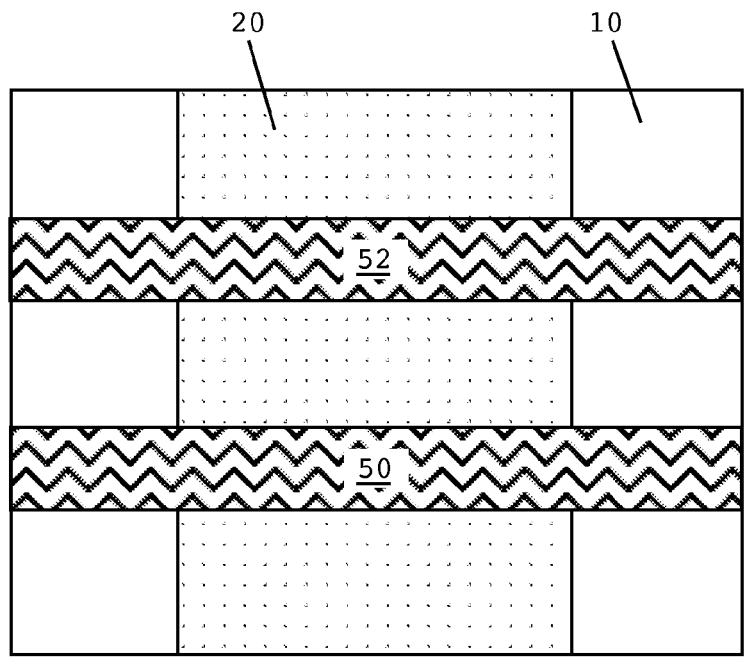
FIGS. 7-12 are demonstrative illustrations of top and cross-sectional views of a method of forming the semiconductor device of FIGS. 4-6.

FIGS. 7-12 are demonstrative top and cross-sectional illustrations of steps in the formation of semiconductor device 100. FIG. 7 shows a top view, with active gate 50 and inactive gate structure 52 formed on substrate 20 and STI 10.

Figure 8:
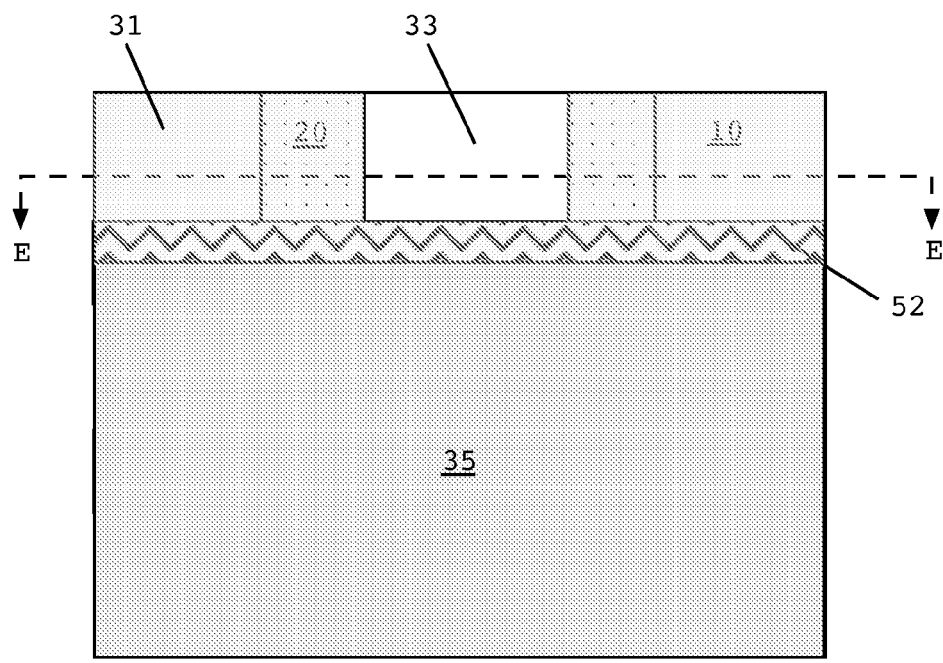
Figure 9:
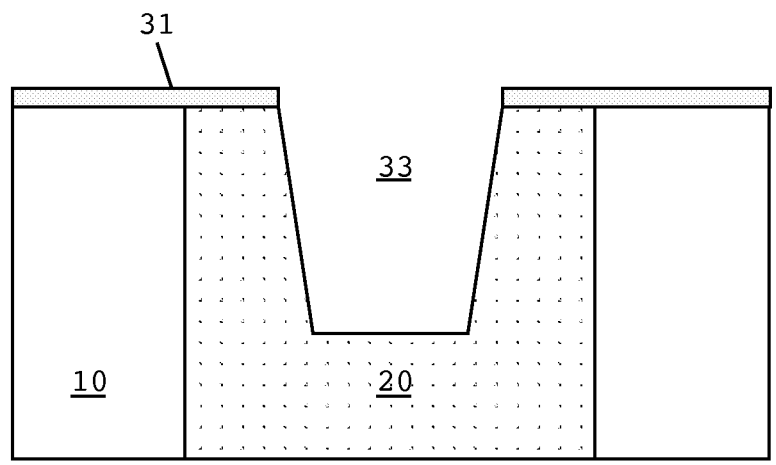

In FIG. 8, a blanket layer of silicon nitride 31 is deposited and a resist layer 35 is spun atop a wafer in which semiconductor device 100 will be formed. Resist layer 35 is then lithographically etched to leave a portion of substrate 20 adjacent inactive gate structure 52 uncovered by resist layer 35. The exposed portion of silicon nitride layer 31 and substrate 20 are then etched using, for example, reactive ion etching (RIE), to form a recess 33. FIG. 9 provides a cross-sectional view of the formation of recess 33 and unetched portions of substrate 20 and STI 10 covered by silicon nitride layer 31.

Figure 10:
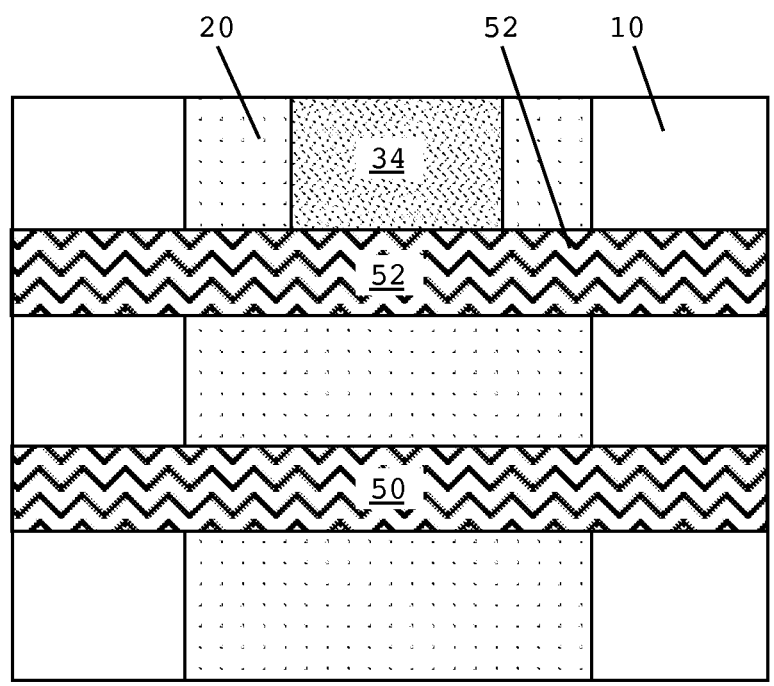

FIG. 10 shows another top view following removal of silicon nitride layer 31 and resist layer 35 and the formation of SiGe:B region 34 in recess 33 (FIG. 8). SiGe:B region 34 may be formed, for example, using epitaxial techniques.

Figure 11:
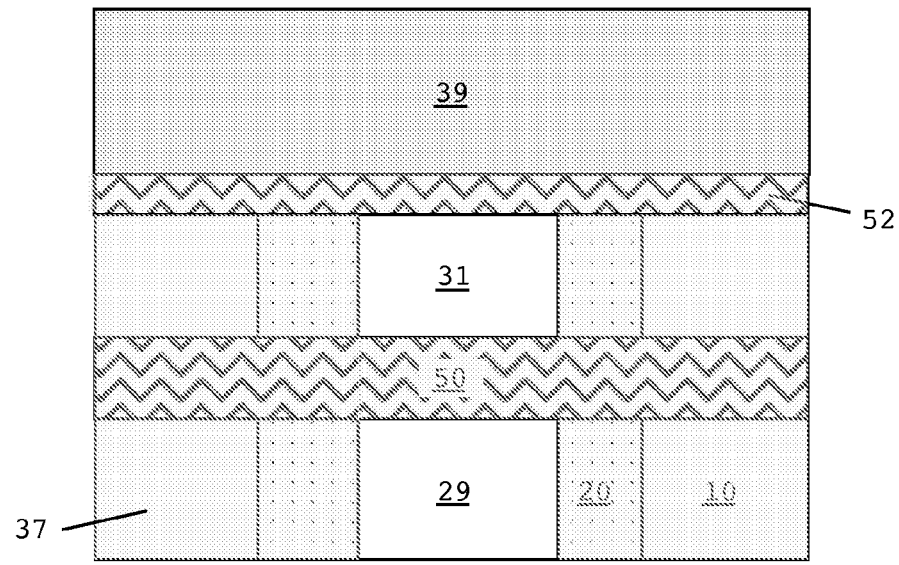
Figure 12:
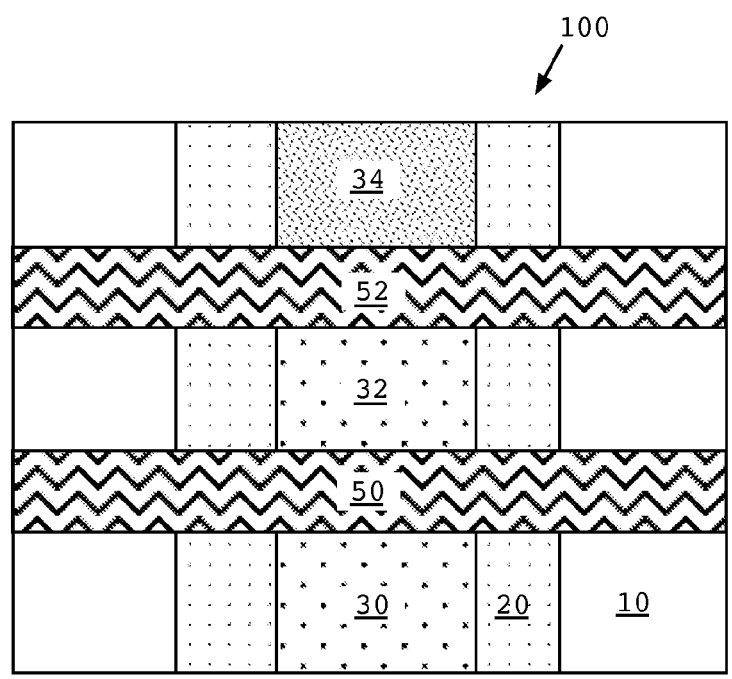

In FIG. 11, a silicon nitride layer 37 and a resist layer 39 are formed, similar to FIG. 8 above. In FIG. 11, SiGe:B region 34 (FIG. 10) and adjacent portions of substrate 20 and STI 10 are covered by resist layer 39, and portions of active gate 50, substrate 20, and STI 10 are covered by silicon nitride layer 37. Recesses 29, 31 are then etched into substrate 20, similar to the formation of recess 33 (FIG. 8). FIG. 12 shows semiconductor device 100 with silicon nitride layer 37 (FIG. 11) and resist layer 39 (FIG. 11) removed and first SiC:P region 30 and second SiC:P region 32 formed by, for example, epitaxial techniques.

Figure 13:
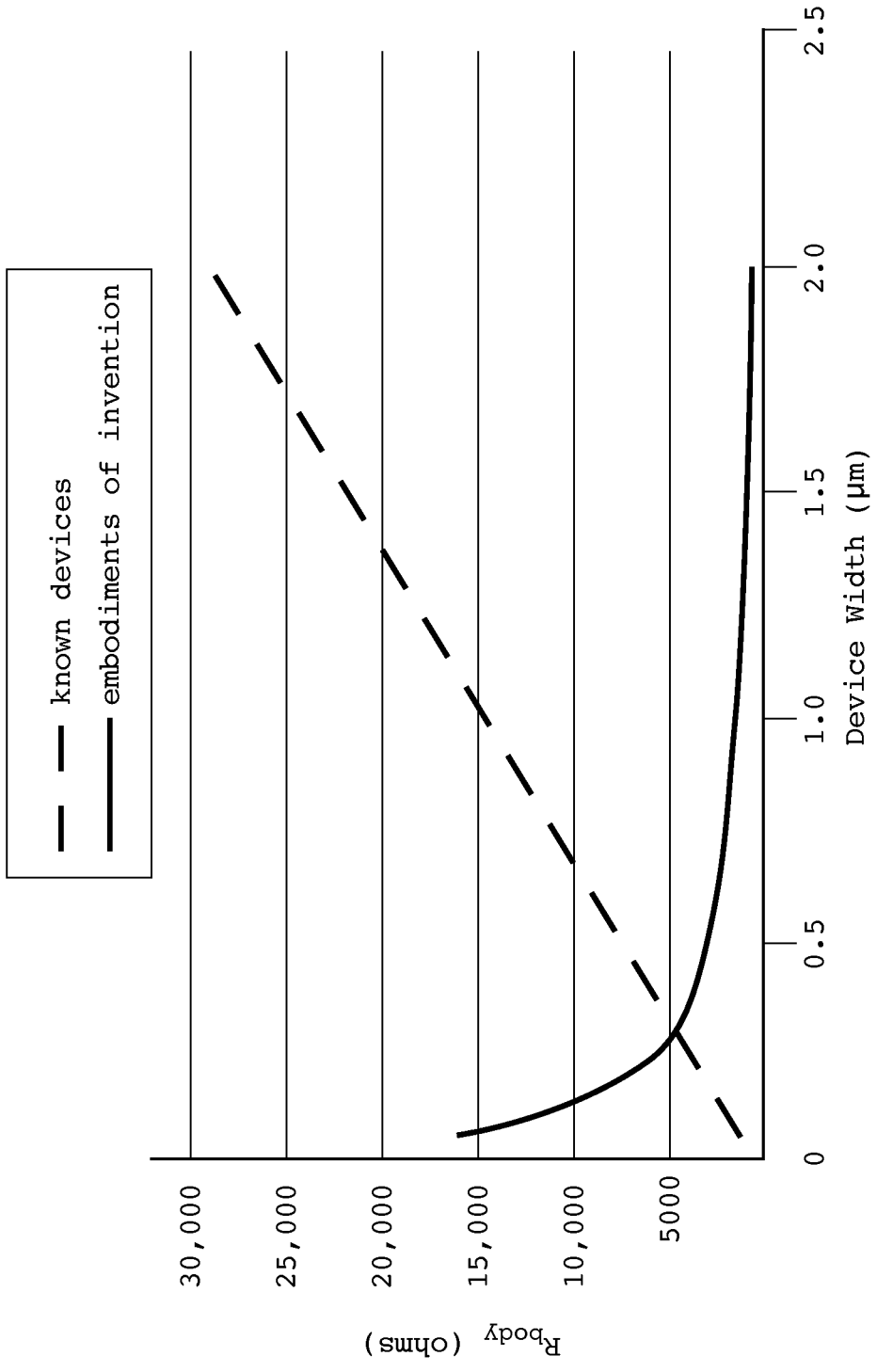
FIG. 13 is a graphical representation of body resistance as a function of semiconductor device width for both known semiconductor devices and semiconductor devices according to embodiments of the invention.

FIG. 13 is an illustrative graphical representation of body resistance as a function of semiconductor device width for both known semiconductor devices and semiconductor devices according to embodiments of the invention. As can be seen in FIG. 13, for semiconductor devices having a width greater than about 0.35 μm, which is the case for most logic devices and analog devices, body resistance of semiconductor devices according to embodiments of the invention is less than the body resistance of known semiconductor devices. What is more, this difference increases dramatically with increasing semiconductor device width, with body resistances of known semiconductor devices increasing in a substantially linear fashion while the body resistances of semiconductor devices according to embodiments of the invention steadily decrease. In fact, for semiconductor devices having a width of about 1.0 μm, body resistances are reduced in embodiments of the invention by approximately an order of magnitude, as compared to body resistances of known semiconductor devices. For semiconductor devices having a width of about 2.0 μm, this reduction in body resistances approaches two orders of magnitude.

Figure 14:
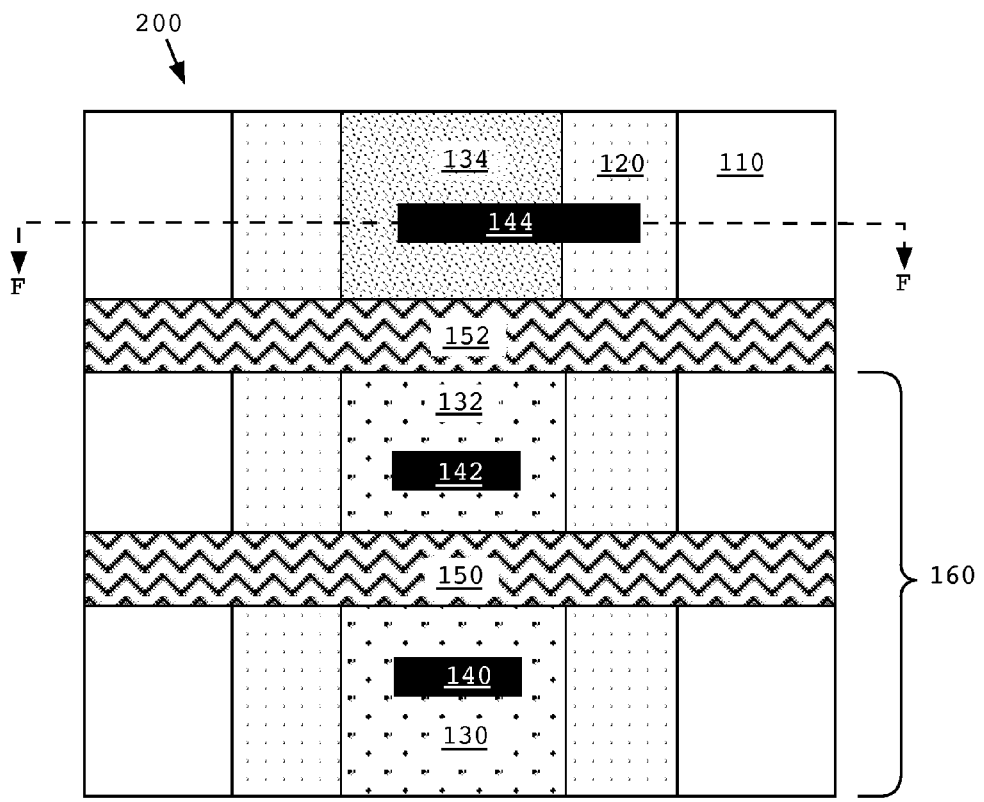
FIGS. 14 and 15 are demonstrative illustrations of top and cross-sectional views, respectively, of a semiconductor device according to another embodiment of the invention.
Figure 15:
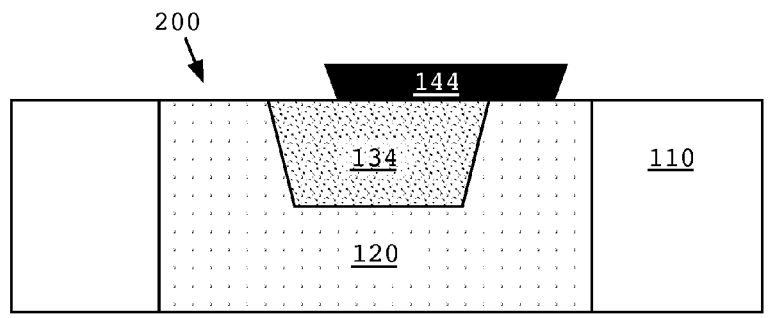

FIG. 14 is a demonstrative illustration of a top view of a semiconductor device 200 according to another embodiment of the invention. Here, body contact 144 extends across SiGe:B region 134 and substrate 120. As a consequence, SiGe:B region 134 and substrate 120 have the same bias. FIG.

15 is a demonstrative illustration of a cross-sectional view of semiconductor device 200 taken through axis F-F of FIG. 14.

Figure 16:
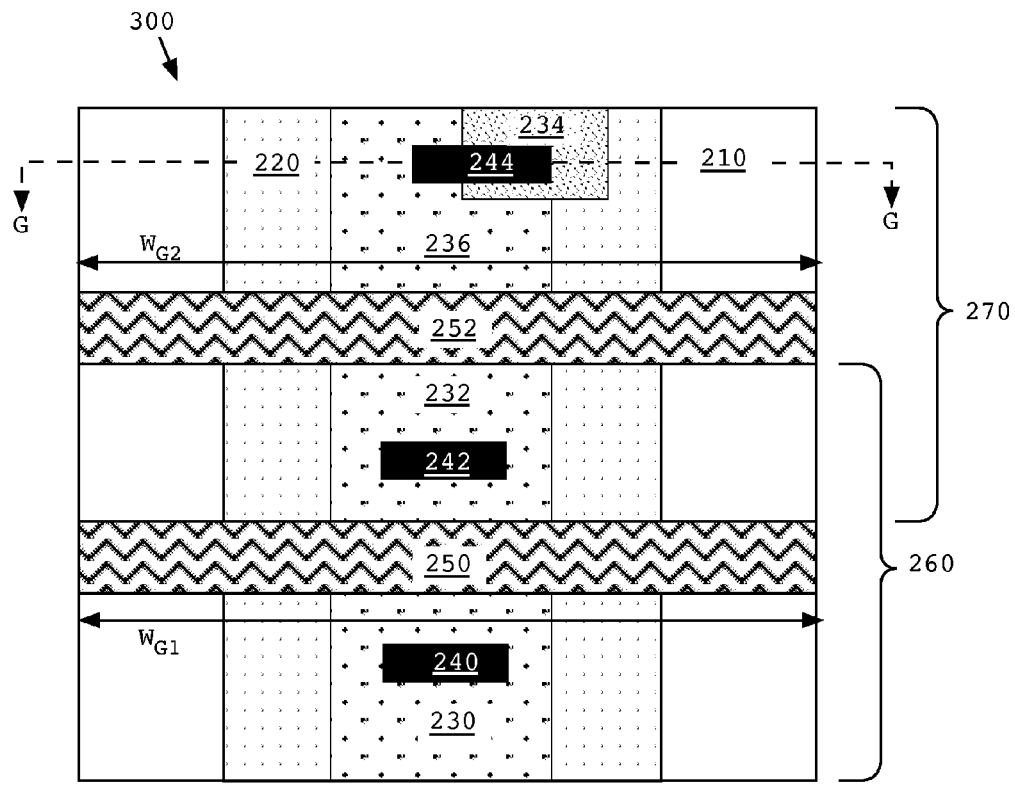
FIGS. 16 and 17 are demonstrative illustrations of top and cross-sectional views, respectively, of a semiconductor device according to still another embodiment of the invention.
Figure 17:
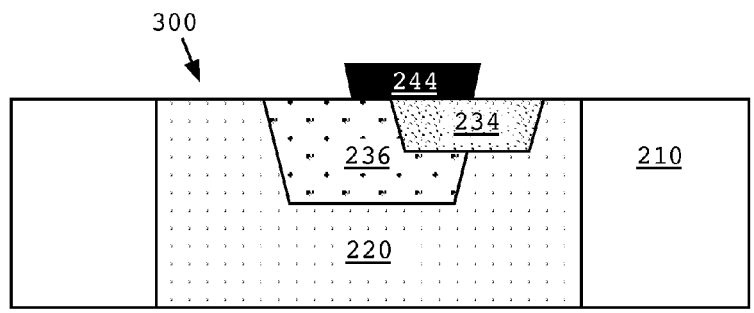

FIGS. 16 and 17 are demonstrative illustrations of another embodiment of the invention. In FIG. 16, semiconductor device 300 includes a second n-FET 270 adjacent n-FET 260. Second n-FET 270 comprises third SiC:P region 236, second gate 252 (which is active), and second SiC:P region 232. Discharge paths of n-FET 260 and second n-FET 270 are oriented substantially perpendicular to width $W_{G1}$ of first gate 250 and width $W_{G2}$ of second gate 252, as in the embodiments shown in FIGS. 4-6, 14, and 15. As in embodiments described above, first SiC:P region 230 may act as a source or drain, depending on the application, with second SiC:P region 232 acting as its counterpart. Contacts 240 and 242 provide for electrical connection to first SiC:P region 230 and second SiC:P region 232, respectively. In FIG. 16, contact 244 bridges third SiC:P region 236 and SiGe:B region 234, providing a common bias.

FIG. 17 shows semiconductor device 300 in cross-section through axis G-G of FIG. 16. Body contact 244 bridges SiGe:B region 234 (acting as the device body) and third SiC:P region 236, which saves space and results in SiGe:B region 234 and third SiC:P region 236 being commonly biased.

Figure 18:
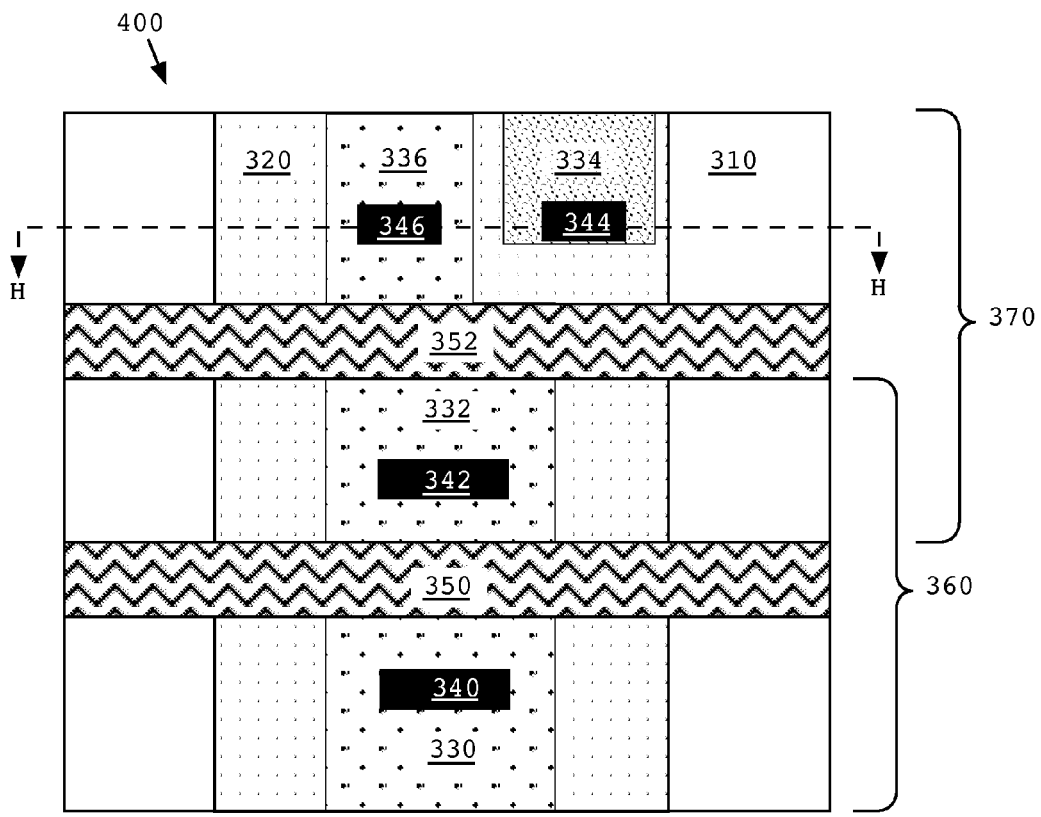
FIGS. 18 and 19 are demonstrative illustrations of top and cross-sectional views, respectively, of a semiconductor device according to yet another embodiment of the invention.
Figure 19:
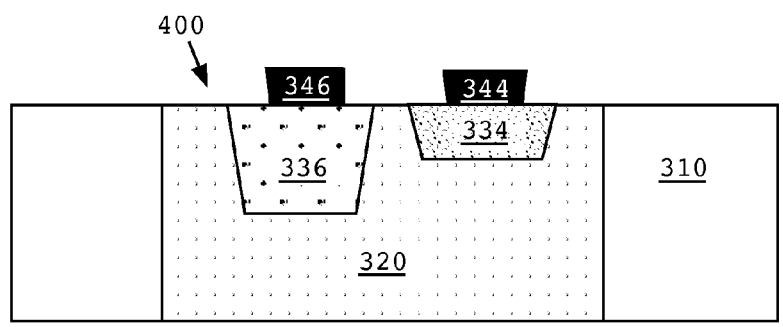

FIGS. 18 and 19 are demonstrative illustrations of yet another embodiment of the invention. In FIG. 18, third SiC:P region 336 has its own contact 346 and SiGe:B region 334 is separated from third SiC:P region 336 within substrate 320.

FIG. 19 shows semiconductor device 400 in cross-section through axis H-H of FIG. 18. In the embodiment shown in FIGS. 18 and 19, SiGe:B region 334 (acting as the device body) and third SiC:P region 336 may be separately biased.

Figure 20:
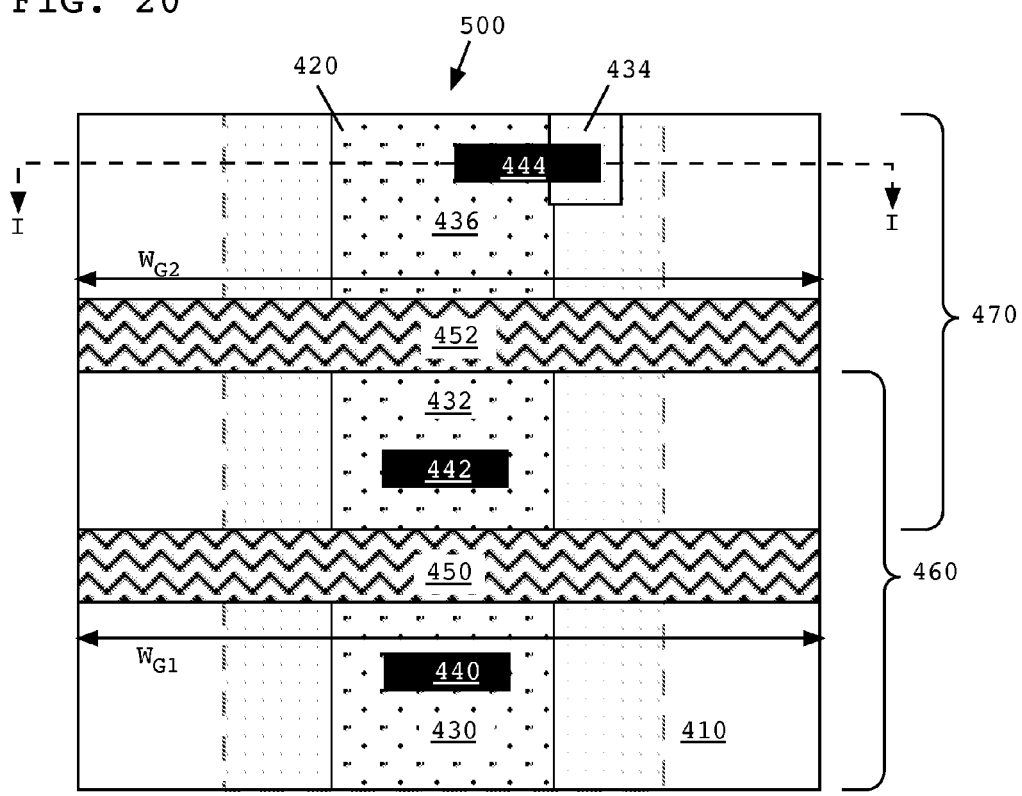
FIGS. 20 and 21 are demonstrative illustrations of top and cross-sectional views, respectively, of a semiconductor device according to another embodiment of the invention.

FIG. 20 is a demonstrative illustration of a top view of still another embodiment of the invention. Here, semiconductor device 500 includes a first n-FET 460 adjacent a second n-FET 470. Again, discharge paths of first n-FET 460 and second n-FET 470 are oriented substantially perpendicular to width $W_{G1}$ of first gate 450 and width $W_{G2}$ of second gate 452, as in the embodiments described above. Third SiC:P region 436 and common body 434 share a cross-contact 444, similar to the embodiment shown in FIGS. 16 and 17.

Figure 21:
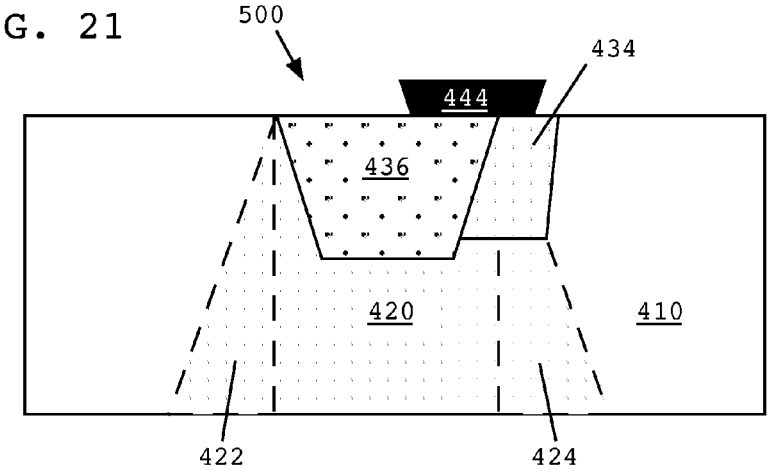

However, unlike the embodiments described above, a portion of substrate 420 between STI 410 is substantially wedge shaped in cross-section, as can be seen in FIG. 21, which shows a cross-sectional view of semiconductor device 500 taken through axis I-I of FIG. 20. That is, sides of a portion of substrate 420 are angled with respect to an upper surface of STI 410, such that a portion of substrate 420 results in substrate tabs 422, 424 extending beneath a portion of STI 410. By "beneath," it is meant that a lower portion of substrate 420 extends laterally to a greater distance than does an upper portion of substrate 420, such that the lower portion of substrate 420, when viewed in a plane normal to an upper surface of STI 410, is disposed beneath a portion of STI 410. One skilled in the art will recognize, of course, that substrate 420 may extend below what is shown in FIG. 21, such that a non-wedge-shaped portion of the substrate, while residing beneath STI 410, does not constitute a substrate tab, since such a portion of the substrate does not have a wedge shape in cross-section.

Substrate tabs 422, 424 provide a current channel between first n-FET 460 and second n-FET 470, which serves a dual function. First, the current channel improves the efficiency of the discharge paths of first n-FET 460 and second n-FET 470. Second, the current channel ensures that first n-FET 460 and second n-FET 470 are self-balanced and share the same potential. That is, first n-FET 460 and second n-FET 470 are self-balanced in that a change in potential of first n-FET 460 will be at least partially distributed to second n-FET 470 such that first n-FET 460 and second n-FET 470 equalize at approximately the same potential. One skilled in the art will recognize, of course, that a change in potential of second n-FET 470 will similarly be at least partially distributed to first n-FET 460.

Figure 22:
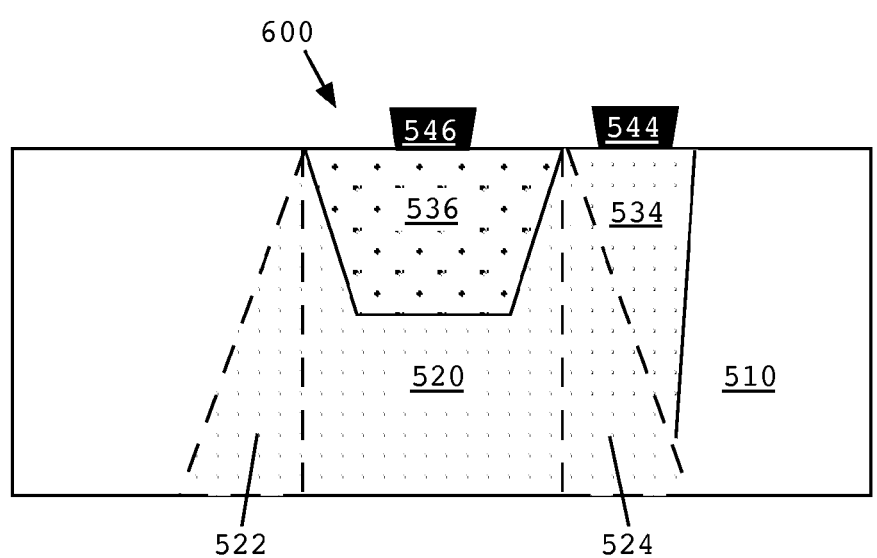
FIG. 22 is a demonstrative illustration of a cross-sectional view of a semiconductor device according to still another embodiment of the invention.

In the embodiment shown in FIGS. 20 and 21, common body 434 comprises a substrate (e.g., silicon) pad. This eliminates the need for a separately formed common body, although this is neither necessary nor essential. Other embodiments of the invention may include, for example, a separate region contact 546 and body contact 544, as shown, for example, in FIG. 22. Such decoupling or independence of region contact 546 and body contact 544, while still providing a common potential and self-balancing among FET devices, enables biasing of region 536 in order to tune and improve power management of individual FET devices.

Semiconductor devices including FETs according to embodiments of the invention, including those embodiments described above, may be formed using conventional techniques and methods, as will be recognized by one skilled in the art. Such techniques and methods include, for example, ion implantation, reactive ion etching (RIE), lithographic techniques such as photolithography, and epitaxial techniques.

Semiconductor devices according to various embodiments of the invention can be distributed by a fabricator in a raw wafer form (that is, a single wafer that has multiple unpackaged integrated circuit chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other single processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
 a substrate;
 a field effect transistor (FET) comprising:
  a source within the substrate;
  a drain within the substrate; and
  an active gate atop the substrate and between the source and the drain;
 an inactive gate structure atop the substrate and adjacent the source or the drain;
 a body adjacent the inactive gate; and
 a discharge path within the substrate for releasing a charge from the FET, the discharge path lying between the active gate of the FET and the body,
 wherein the discharge path is substantially perpendicular to a width of the active gate, the width of the active gate being a distance along a longitudinal axis of the active gate from a first end of the active gate to a second end of the active gate opposite the first end.

2. The semiconductor device of claim 1, further comprising:
 a body contact atop the body and bridging the body and the substrate.

3. The semiconductor device of claim 1, wherein a distance between the active gate and the inactive gate structure is between about 50 nm and about 200 nm.

4. The semiconductor device of claim 1, wherein a portion of the substrate positioned between a pair of shallow trench isolations (STIs) is substantially wedge shaped in cross-section.

5. The semiconductor device of claim 4, wherein the portion of the substrate includes at least one substrate tab extending beneath a portion of at least one of the STIs.

6. A semiconductor device comprising:
 a substrate;
 a first field effect transistor (FET) comprising:
  a first source within the substrate;
  a first drain within the substrate; and
  a first gate atop the substrate and between the first source and the first drain;
 a second FET adjacent the first FET, the second FET comprising:
  a second gate atop the substrate and adjacent the first drain of the first FET; and
  a second drain within the substrate and adjacent the second gate;
 a common body adjacent the second drain; and
 a discharge path within the substrate for releasing a charge from each of the first FET and the second FET, the discharge path lying between the first source and the common body,
 wherein the discharge path is substantially perpendicular to a width of the first gate, the width of the first gate being a distance along a longitudinal axis of the first gate from a first end of the first gate to a second end of the first gate opposite the first end.

7. The semiconductor device of claim 6, further comprising:
 a body contact atop the common body and bridging the common body and the second drain.

8. The semiconductor device of claim 6, further comprising:
 a pair of shallow trench isolations (STIs),
 wherein a portion of the substrate positioned between the pair of STIs is substantially wedge shaped in cross-section, a lower portion of the portion of the substrate extending laterally to a greater distance than an upper portion of the portion of the substrate, such that the lower portion is disposed beneath a portion of at least one of the STIs.

9. The semiconductor device of claim 8, wherein the portion of the substrate includes at least one substrate tab extending beneath a portion of at least one of the STIs.

10. The semiconductor device of claim 9, wherein the at least one substrate tab extends between the first FET and the second FET.

11. The semiconductor device of claim 10, wherein the first FET and the second FET are self-balancing, such that at least a portion of a change in potential of the first FET is transferred, through the at least one substrate tab, to the second FET and at least a portion of a change in potential of the second FET is transferred, through the at least one substrate tab, to the first FET.

12. The semiconductor device of claim 6, further comprising:
 a body contact atop and electrically connected to the common body and independent of both the first FET and the second FET.

13. A semiconductor device comprising:
 a substrate;
 a field effect transistor (FET) comprising:
  a source within the substrate;
  a drain within the substrate; and
  an active gate atop the substrate and between the source and the drain;
 an additional gate atop the substrate and adjacent the source or the drain; and
 a body adjacent the additional gate,
 wherein the substrate includes a portion positioned between a pair of shallow trench isolations (STIs), the portion of the substrate having a substantially wedge shaped cross-section, a lower portion of the portion of the substrate extending laterally to a greater distance than an upper portion of the portion of the substrate, such that the lower portion is disposed beneath a portion of at least one of the STIs.

14. The semiconductor device of claim 13, wherein the additional gate is an inactive gate separated from the active gate by between about 50 nm and about 200 nm.

15. The semiconductor device of claim 13, further comprising:
 a discharge path substantially perpendicular to a width of the active gate and running from the active gate of the FET to the body, the width of the active gate being a distance along a longitudinal axis of the active gate from a first end of the active gate to a second end of the active gate opposite the first end.

16. The semiconductor device of claim 13, further comprising:
 an additional FET adjacent the FET, the additional FET comprising:
  the additional gate; and
  an additional drain within the substrate and adjacent the additional gate.

17. The semiconductor device of claim 16, wherein the portion of the substrate includes at least one substrate tab extending between the FET and the additional FET.

18. The semiconductor device of claim 17, wherein the FET and the additional FET are self-balancing, such that at least a portion of a change in potential of the FET is transferred, through the at least one substrate tab, to the additional FET and at least a portion of a change in potential of the additional FET is transferred, through the at least one substrate tab, to the FET.

19. The semiconductor device of claim 16, further comprising:
a body contact atop and electrically connected to the body and independent of both the FET and the additional FET.

20. The semiconductor device of claim 16, wherein a distance between the active gate and the additional gate is between about 50 nm and about 200 nm and the FET includes a discharge path substantially perpendicular to a width of the active gate and running from the active gate of the FET to the body, the width of the active gate being a distance along a longitudinal axis of the active gate from a first end of the active gate to a second end of the active gate opposite the first end.

* * * * *